United States Patent
Behl

(10) Patent No.: US 6,676,505 B2
(45) Date of Patent: Jan. 13, 2004

(54) MEMORY STORAGE DEVICE DOCKING ADAPTER HAVING A HINGED AIR FILTER COVER

(75) Inventor: Sunny Behl, San Jose, CA (US)

(73) Assignee: Inclose Design, Inc., San Jose, CA (US)

(*) Notice: Subject to any disclaimer, the term of this patent is extended or adjusted under 35 U.S.C. 154(b) by 193 days.

(21) Appl. No.: 10/001,238

(22) Filed: Oct. 30, 2001

(65) Prior Publication Data

US 2002/0106919 A1 Aug. 8, 2002

Related U.S. Application Data

(63) Continuation of application No. 09/596,352, filed on Jun. 17, 2000, now Pat. No. 6,319,116, which is a continuation-in-part of application No. 09/290,113, filed on Apr. 12, 1999, now Pat. No. 6,193,339.

(51) Int. Cl.[7] .................................................. H05K 5/00
(52) U.S. Cl. ...................................... 454/184; 55/385.2
(58) Field of Search .............................. 454/187, 184; 361/753, 752, 695; 55/385.2, 470, 385.4, 493, 505, 467

(56) References Cited

U.S. PATENT DOCUMENTS

| | | | | |
|---|---|---|---|---|
| 4,751,872 A | * | 6/1988 | Lawson, Jr. | 454/184 |
| 4,889,542 A | * | 12/1989 | Hayes | 95/285 |
| 5,163,870 A | * | 11/1992 | Cooper | 454/184 |
| 5,725,622 A | * | 3/1998 | Whitson et al. | 55/385.4 |
| 6,449,150 B1 | * | 9/2002 | Boone | 361/694 |

* cited by examiner

Primary Examiner—Derek Boles
(74) Attorney, Agent, or Firm—James D. Ivey

(57) ABSTRACT

A hard disk drive docking adapter includes a rack and a slide with fans, a hinged door, a door-mounted air filter, and a hinged air filter cover. The door locks the slide to the rack and the air filter cover hinges to hold the air filter the door. The hinges of the cover oppose the hinges of the door to prevent the door from opening when the cover is removed for air filter replacement.

20 Claims, 3 Drawing Sheets

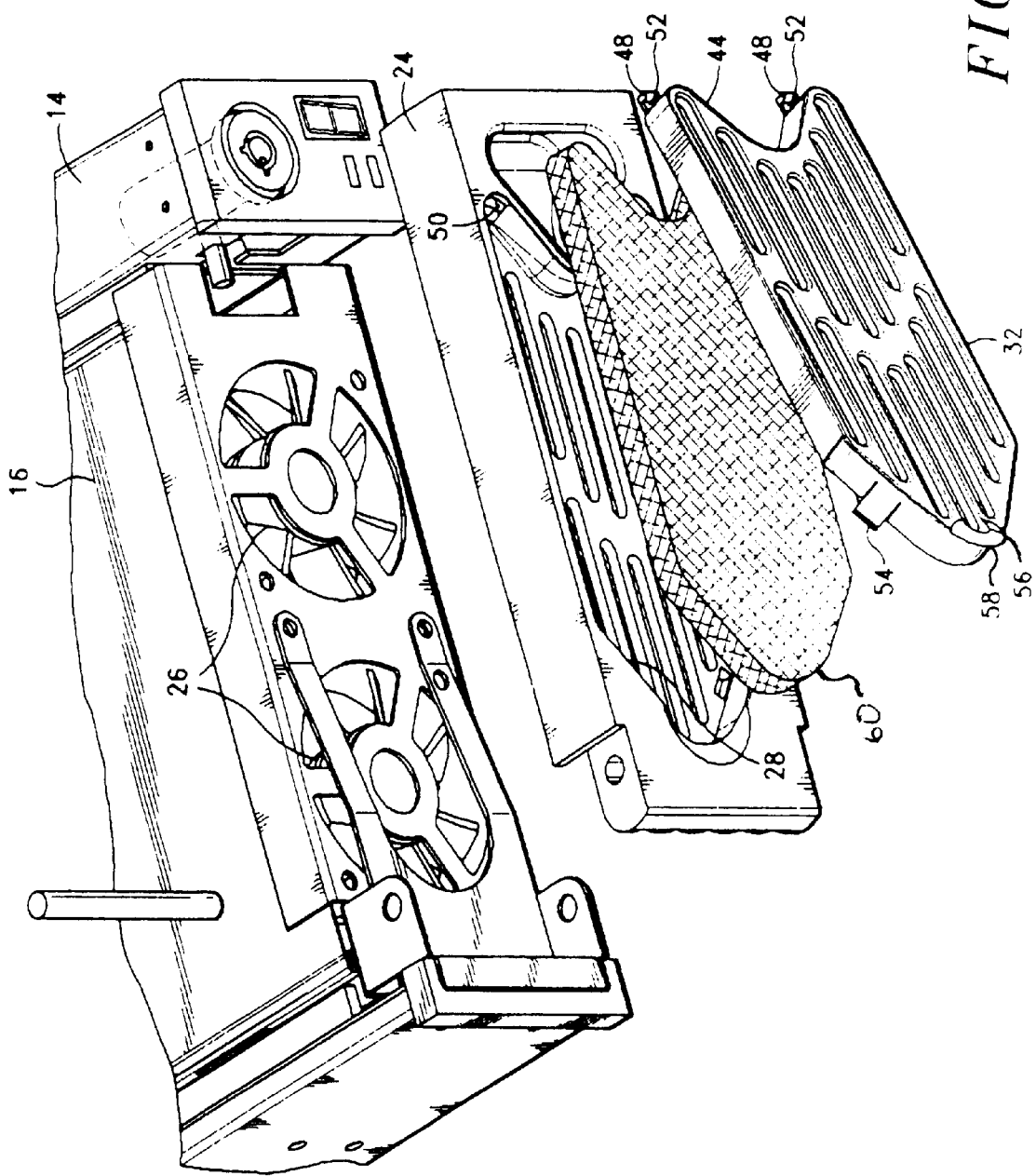

MEMORY STORAGE DEVICE DOCKING ADAPTER HAVING A HINGED AIR FILTER COVER

CROSS REFERENCE TO RELATED APPLICATIONS

This is a continuation application of U.S. patent application Ser. No. 09/596,352 filed Jun. 17, 2000 is now U.S. Pat. No. 6,319,116 which is a continuation-in-part of commonly assigned U.S. patent application Ser. No. 09/290,113 filed Apr. 12, 1999 is now U.S. Pat. No. 6,139,339, entitled Docking Adapter for Memory Storage Devices the disclosure of which is incorporated by reference.

This patent application relates in subject matter to commonly assigned U.S. Pat. No. 5,886,639, the disclosure of which is incorporated herein by reference.

FIELD OF THE INVENTION

The present invention pertains to docking adapters for memory storage devices, and more particularly to docking adapters having cooling fans and air filters.

BACKGROUND OF THE INVENTION

U.S. patent application Ser. No. 09/290,113 (hereinafter '113 application) discloses a docking adapter having a rack that mounts in a memory storage device housing and a slide that holds a hard disk drive. The slide includes fans for cooling the hard disk drive. The slide also includes a door for covering the fans when the slide mounts the hard disk drive in the memory storage device housing.

Air filters are useful for keeping dust out of computer cases. An air filter can be readily mounted within the door to filter air. An air filter is disclosed in U.S. Pat. No. 5,886,639, which is incorporated herein by reference. It is known that air filters should be removed, cleaned and replaced to prevent dust accumulation in the air filter.

One limitation of the '113 application is that in order to remove an air filter mounted in the door, the door must be opened. Opening the door may cause the slide to slide out from the rack and disable functioning of the hard disk drive. What is desired is a way of replacing an air filter of a slide without disturbing operation of the hard disk drive.

SUMMARY OF THE INVENTION

A hard disk drive docking adapter includes a rack and a slide with an air filter, an air filter cover and fans. The rack is fixed in a hard disk drive housing. The slide removably mounts a hard disk drive, or other memory storage device in the rack. This enables hot swapping of the hard disk drive. The fan attaches to the slide for cooling the hard disk drive with air from outside of the hard disk drive housing.

The slide has a door having a hinged end and a locking end, and the hinged end attaches to the rack for moving the door from a closed position where the door locks the slide within the rack. The door hinges to an open position to release the slide from the rack and enable removal of the slide. The door defines airways to enable the fan to draw air through the door when the door is closed. The air filter mounts on the door. The air filter cover holds the air filter. The cover has a hinged end opposing the hinged end of the door. Opposing hinges enables the door, and the slide, to be undisturbed when the air filter cover is opened. Removal and replacement of the air filter during operation of the docking adapter is enabled.

BRIEF DESCRIPTION OF THE DRAWINGS

FIG. 3 is an exploded perspective view of a docking adapter having an air filter cover with detents for hinging the cover to the door.

DETAILED DESCRIPTION

Figure 1:
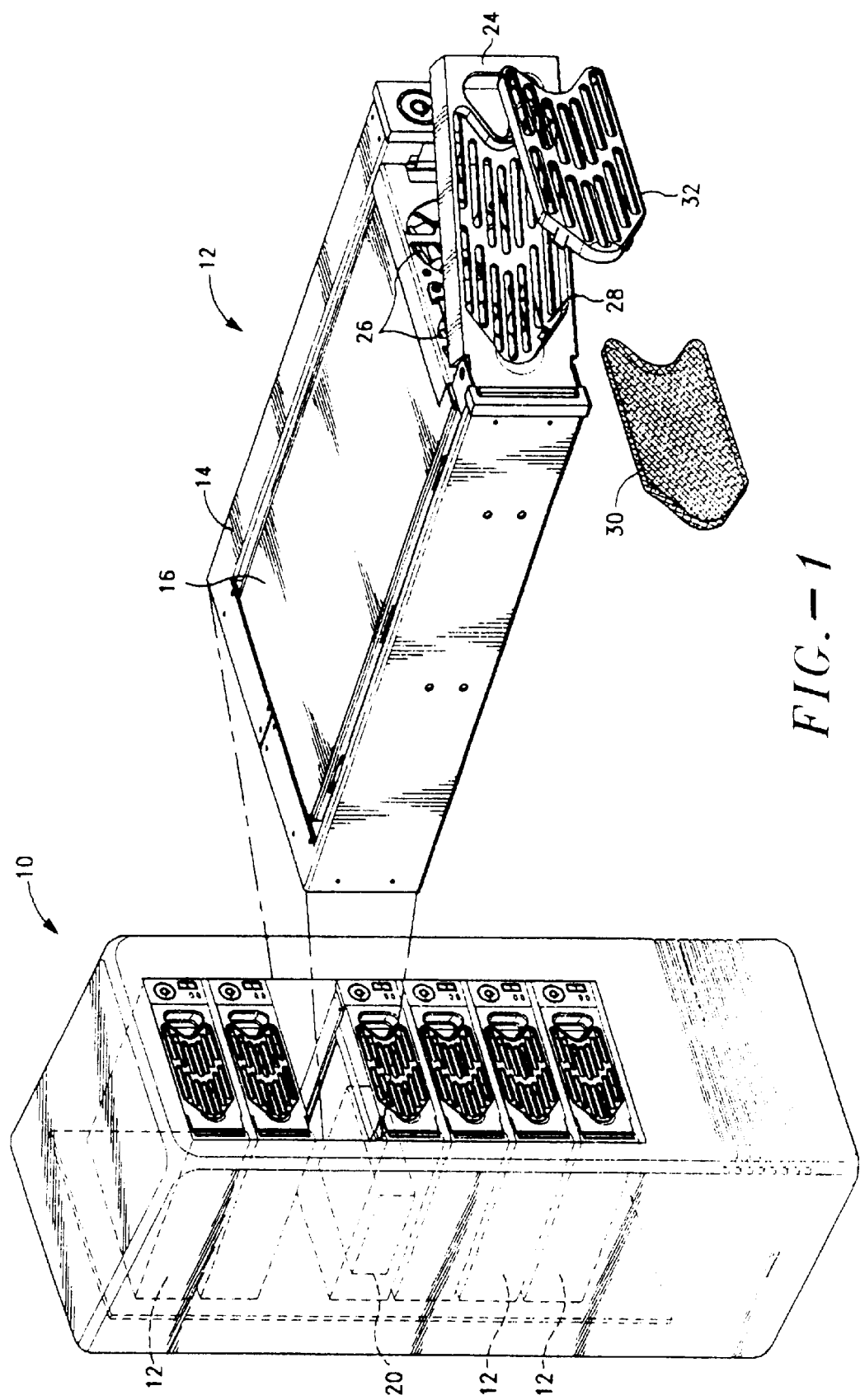
FIG. 1 is a perspective view of a memory storage device housing with multiple docking adapters.

FIG. 1 shows a memory storage device housing, generally designated with the reference numeral 10, in accordance with the present invention. The memory storage device hosing 10 includes multiple docking adapters 12 that hold hard disk drives 20. Commonly assigned U.S. patent application Ser. No. 09/290,113 discloses a docking adapter for memory storage devices and is incorporated herein by reference.

Each memory storage device adapter 12 includes a rack 14 that mounts in the memory storage device housing and a slide 16 that slides with respect to the rack 14 to removable hold a hard disk drive 20 in the slide 16.

The slide 16 includes a door 24 and fans 26. The door 24 opens. The door 24 closes to protect the fans and to lock the slide 24 in the rack 14. The door 24 includes a recessed portion 28 with airways to enable convection through the door 24, an air filter 30 and an air filter cover 32, The air filter 30 seats in the recessed portion 28 of the door 24 and the cover 32 holds the air filter 30 against the recessed portion 28. It can be appreciated, however, that the cover 32 can also be designed to hold the air filter 30 against a door without a recessed portion. Preferably, the cover 32 allows the filter 30 to maintain shape to optimize filtering capability of the filter 30.

Figure 2:
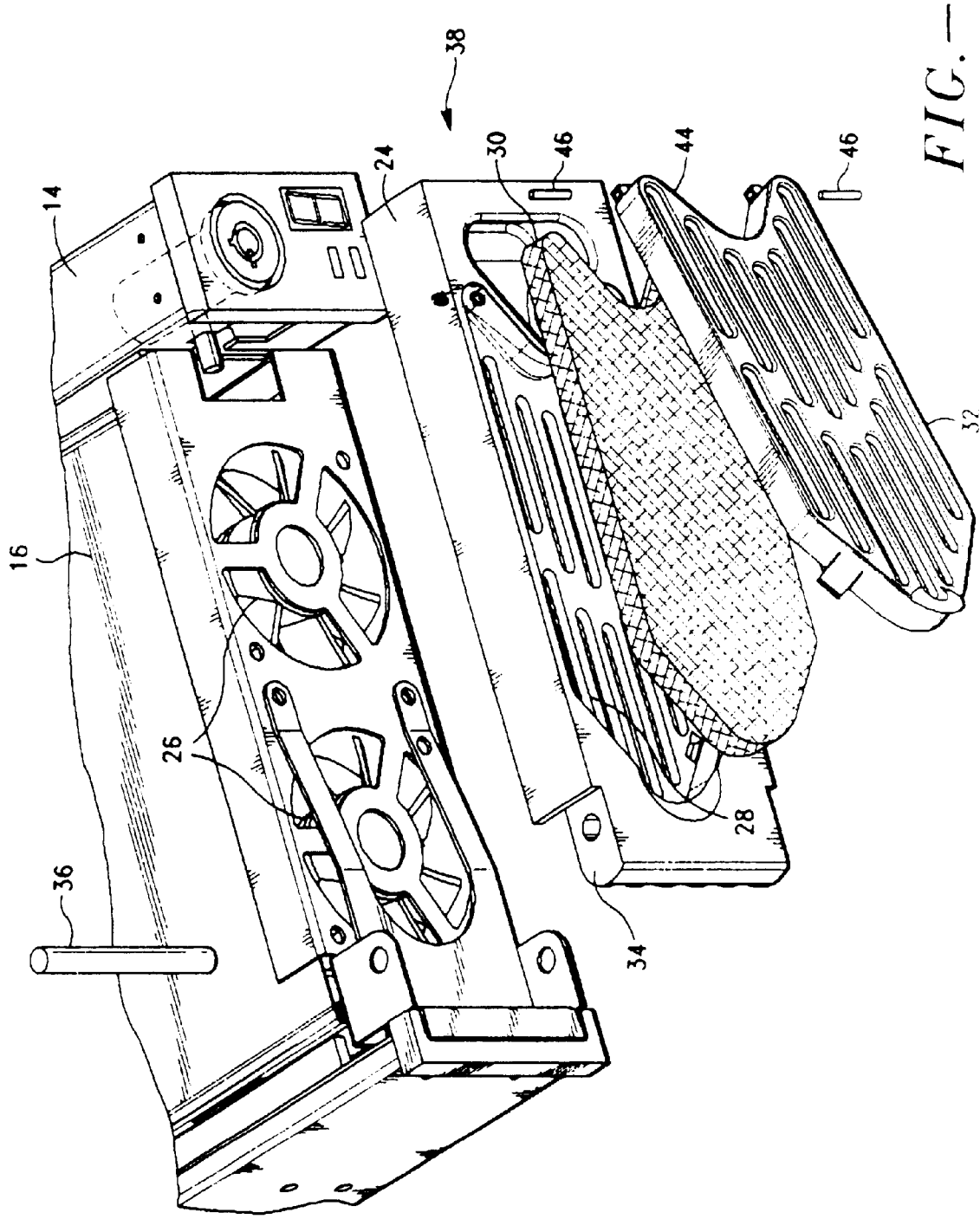
FIG. 2 is an exploded perspective view of a docking adapter having an air filter cover with hinge pins.

FIG. 2 shows the door 24 having a hinged end 34 and a hinge pin 36. The cover has a hinged end 44 and two hinged pins 46. The hinged end 44 of the cover 32 opposes the hinged end 34 of the door 24. The hinge pin 36 hinges the door 24 to the slide 16.

The door 24 has a locking end 38 that swings free when the door 24 opens. The locking end 38 locks to the docking adapter 10 when the door holds the slide 16 and rack together 14. The cover 32 hinges to the locking end 38.

The door 24 defines airways to enable the fan 26 to draw air through the door 24 when the door 24 is in the closed position, against the slide 16. The door 24 also shields the fans 24 from the air filter 30 to enable the air filter 30 to be replaced when the fans 24 operate.

One reason for hinging the cover 32 to the locking end 38 of the door 24 is to assure operation of the hard drive 20 (FIG. 1) remains undisturbed when the filter 30 is removed and replaced. Hinging the cover 32 to the locking end 38 of the door 24 prevents the door 24 from moving. Accordingly, the slide 16 does not unlock form the rack 14 as a result of an air filter 30 change. The air filter 30 can be removed and replaced during operation of the docking adapter 10 (FIG. 1).

FIG. 3 shows the cover 32 having the hinged end 44 and a grippable end 56. The hinged end 44 includes detent 48. The door 24 has openings 50 within the recessed portion 28, near the locking end 38 of the door 24. The detents 48 include hooks 52 that hook the door 24 at the openings 50 and enable the cover 32 to hinge with respect to the door 24. The hooks 52 hold the cover 32 when the door 24 opens so that the cover 32 will not prematurely separate from the door 24. Preferably, the hooks 52 hold the cover 32 when an angle between the cover 32 and the door 24 is less than thirty degrees, for example. When the angle between the cover 32 and the door 24 exceeds thirty degrees, for example, the hooks 52 release the cover 32 from the door 24. It can be appreciated that the thirty-degree angle here is exemplary only and that this angle can vary depending on the shape and configuration of the mechanism used to hinge the filter cover 32 to the door 24.

Releasing the cover 32 from the door is desirable to enable the cover 32 to hold the filter 30 when the filter 30 is full of dust. The filter 30 is later removed from the cover 32 when the filter 30 is distanced from the slide 16 to prevent the dust collected in the filter 30 from contaminating the slide 16 and/or memory storage device housing 10. Removal of the cover 32 from the door 24 is also desirable when the filter 30 and cover 32 hold excessive dust because the dust may enter the spinning fans 26 if the cover 32 is not removed. The filter 30 can be removed during operation of the docking adapter 12.

The cover 32 has clips 54. The cover 32 hinges from a closed position where the clips 54 lock the cover 32 against the door 32, in the recessed portion 28 of the door 32, to an open position where the cover 32 hinges out from the door 24.

The grippable end of the cover 32 includes a finger handle 58 that extends from the grippable end 56 to enable a user to open the cover 32 from the door 24. The air filter 30 has a grippable end 60 that is contoured to enable the air filter 30 to be easily gripped.

It can be appreciated that the present invention is described with reference to a preferred embodiment of the invention. There are many variations of the shape of the filter 30, the shape and manner of locking of the door 24 and cover 32 variations. It is the inventor's desire that only the claims set forth below define the scope and bounds the invention.

What is claimed is:

1. A hard disk drive docking adapter, comprising:
   a rack;
   a slide removably mountable on the rack, the slide being configured for holding a hard disk drive;
   a fan attached to the slide;
   a door having a hinged end and a locking end, the hinged end attaches to the docking adapter for moving the door from a closed position where the door holds the slide within the rack to an open position, the door defining airways to enable the fan to draw air through the door when the door is in the closed position;
   an air filter mounted on the door; and
   a cover for holding the air filter, the cover having a hinged end attached to the locking end of the door to allow the cover to hinge from a closed position to an open position to enable replacement of the filter while the door is closed.

2. A docking adapter as set forth in claim 1, wherein the hinged end of the cover opposes the hinged end of the door so that replacement of the air filter does not cause the door to open, releasing the slide from the rack.

3. A memory storage device housing as set forth in claim 1, wherein the door has a recessed portion for holding the air filter.

4. A memory storage device housing as set forth in claim 1, wherein the door has a recessed portion, the cover seats in the recessed portion for holding the air filter on the door.

5. A memory storage device housing as set forth in claim 1, wherein the hinged end of the filter cover includes hinge pins for hinging the filter cover on the door.

6. A memory storage device housing as set forth in claim 1, wherein the hinged end of the filter cover includes detents and the door defines an opening for receiving each of the detents to enable the filter cover to hinge to the door.

7. A memory storage device housing as set forth in claim 6, wherein the detents include hooks to enable removal of the cover when the cover opens to a predetermined angle from the door.

8. A memory storage device housing as set forth in claim 6, wherein the detents include hooks to enable removal of the cover when the cover opens to at least thirty degrees from the door.

9. A hard disk drive docking adapter, comprising:
   a rack;
   a slide removably mountable on the rack, the slide being configured for holding a hard disk drive;
   a fan attached to the slide;
   a door having a hinged end and a locking end, the hinged end attaches to the slide for moving the door from a closed position where the door holds the slide within the rack to an open position, the door defining airways to enable the fan to draw air through the door when the door is in the closed position;
   an air filter mounted on the door; and
   a cover for holding the air filter, the cover having a hinged end attached to the locking end of the door to allow the cover to hinge from a closed position to an open position to enable replacement of the filter while the door is closed.

10. A docking adapter as set forth in claim 9, wherein the hinged end of the cover opposes the hinged end of the door so that replacement of the air filter does not cause the door to open, releasing the slide from the rack.

11. A memory storage device housing as set forth in claim 9, wherein the door has a recessed portion for holding the air filter.

12. A memory storage device housing as set forth in claim 9, wherein the door has a recessed portion, the cover seats in the recessed portion for holding the air filter on the door.

13. A memory storage device housing as set forth in claim 9, wherein the hinged end of the filter cover includes hinge pins for hinging the filter cover on the door.

14. A memory storage device housing as set forth in claim 9, wherein the hinged end of the filter cover includes detents and the door defines an opening for receiving each of the detents to enable the filter cover to hinge to the door.

15. A memory storage device housing as set forth in claim 14, wherein the detents include hooks to enable removal of the cover when the cover opens to a predetermined angle from the door.

16. A memory storage device housing as set forth in claim 14, wherein the detents include hooks to enable removal of the cover when the cover opens to at least thirty degrees from the door.

17. A hard disk drive docking adapter, comprising:
   a rack;
   a slide removably mountable on the rack, the slide being configured for holding a hard disk drive;
   a fan attached to the slide;
   a door having a hinged end and a locking end, the hinged end attaches to the slide for moving the door from a closed position where the door holds the slide within the rack to an open position, the locking end locks to the rack when the door is in the closed position; the door defining airways to enable the fan to draw air through the door when the door is in the closed position;

an air filter mounted on the door; and a cover for holding the air filter, the cover having a hinged end attached to the locking end of the door to allow the cover to hinge from a closed position to an open position to enable replacement of the filter when the door is closed, the cover has a grippable end with clips to lock the cover against the door when the door is closed.

18. A memory storage device housing as set forth in claim 17, wherein door has a recessed portion, cover clips lock the cover against the door, in the recessed portion of the door.

19. A memory storage device housing as set forth in claim 17, the grippable end of the cover includes a finger handle that extends from the grippable end to enable a user to open the cover from the door.

20. A memory storage device housing as set forth in claim 17, the grippable end of the cover includes a finger handle that extends from the grippable end to enable a user to open the cover from the door, the air filter has a grippable end that is contoured to enable the air filter to be easily gripped.

* * * * *